(12) United States Patent
Salih

(10) Patent No.: US 6,420,756 B1
(45) Date of Patent: Jul. 16, 2002

(54) SEMICONDUCTOR DEVICE AND METHOD

(75) Inventor: Ali Salih, Mesa, AZ (US)

(73) Assignee: Semiconductor Components Industries LLC, Phoenix, AZ (US)

(*) Notice: Subject to any disclaimer, the term of this patent is extended or adjusted under 35 U.S.C. 154(b) by 0 days.

(21) Appl. No.: 09/802,402

(22) Filed: Mar. 12, 2001

(51) Int. Cl.[7] .............................................. H01L 29/72
(52) U.S. Cl. .................. 257/330; 257/330; 257/332; 257/333; 257/389; 257/401; 257/406; 257/411; 257/412; 438/242; 438/245; 438/388; 438/638; 438/666
(58) Field of Search ................................. 257/305, 330, 257/332, 333, 389, 401, 406, 411, 412; 438/242, 245, 388, 638, 666

(56) References Cited

U.S. PATENT DOCUMENTS 5,744,386 A * 4/1998 Kenney ....................... 257/330

* cited by examiner

*Primary Examiner*—Edward Wojciechowicz
(74) *Attorney, Agent, or Firm*—James J. Stipanuk

(57) ABSTRACT

A semiconductor device (10) has a substrate (20) with a surface (26) for defining a trench (34). A control electrode (45) is disposed at the surface to activate a conduction path (50) along a sidewall (36) of the trench with a control signal ($V_{GATE}$). A dielectric layer (32, 35) is formed between the sidewall and the control electrode to have a first width ($W_{GS}$) adjacent to the surface and a second width ($W_{GC}$) smaller than the first width adjacent to the conduction path.

23 Claims, 5 Drawing Sheets

SEMICONDUCTOR DEVICE AND METHOD

BACKGROUND OF THE INVENTION

The present invention relates in general to semiconductor devices and, more particularly, to power field effect transistors.

Most power transistors are formed with vertical structures to achieve a high current capability and a low on resistance. For example, one type of power metal-oxide-semiconductor field effect transistor, referred to as a trench field effect transistor (FET), has a gate dielectric formed along a vertical sidewall of a trench etched in the top surface of a semiconductor substrate. A gate electrode within the trench controls a conduction channel formed adjacent to the sidewall. Current through the device is routed vertically from a source formed at the top surface through the conduction channel to a drain formed at the bottom surface of the substrate. Trench FETs occupy a smaller die area than planar FETs and therefore have a lower fabrication cost. A power trench FET typically is specified to supply from 0.5 amperes to more than one hundred amperes of current.

However, most existing trench FETs suffer from a high gate to source capacitance, which increases power dissipation by slowing down the device's switching speed. Moreover, a circuit that drives the gate must supply a high current to charge the gate to source capacitance, which further dissipates power. If the gate electrode is recessed away from the top surface of the substrate to reduce the capacitance, the effective gate resistance increases, which slows down the switching speed and reduces the performance of the device.

Hence, there is a need for a power trench field effect transistor which operates with a low gate to source capacitance and a low gate resistance in order to achieve a high switching speed and low power dissipation.

DETAILED DESCRIPTION OF THE DRAWINGS

In the figures, elements having the same reference numbers have similar functionality.

Figure 1:
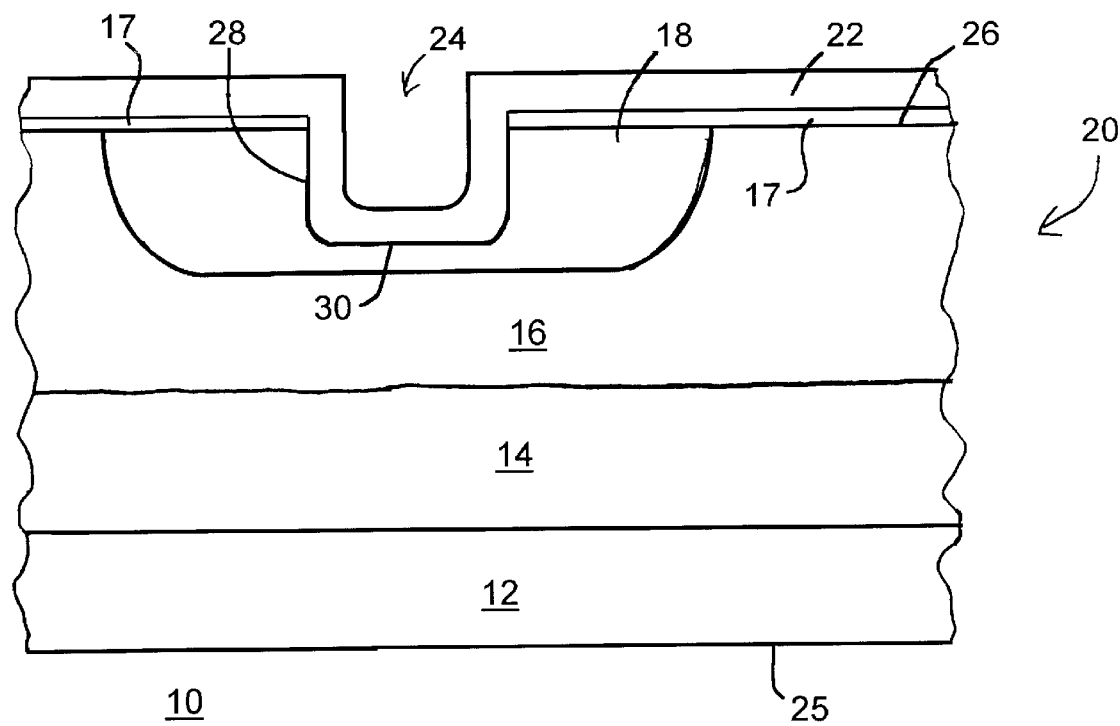
FIG. 1 shows a cross-sectional view of a transistor after a first fabrication step.

FIG. 1 is a cross-sectional view of a transistor 10 after a first fabrication step, including a drain region 12, an epitaxial region 14, a body region 16 and a source region 18 all formed on a semiconductor substrate 20. In one embodiment, transistor 10 comprises an n-channel metal-oxide-semiconductor field effect transistor (FET) and substrate 20 is formed with silicon. Transistor 10 is configured to operate with a drain to gate breakdown voltage ranging between five volts and one hundred volts and to provide a current ranging from 0.5 amperes to more than one hundred amperes.

Drain region 12 is formed at a surface 25 to operate as a drain of transistor 10. In one embodiment, drain region 12 is doped to have an n-type conductivity and a high doping concentration to provide a low electrical resistance to current.

Epitaxial region 14 overlies drain region 12 and has an n-type conductivity and a lighter doping level than drain region 12. The doping concentration and thickness of epitaxial region 14 are selected to provide a drain to source breakdown voltage of thirty volts. In one embodiment, epitaxial region 14 has a thickness of about 3.5 micrometers from a surface 26 of substrate 20 and a doping concentration of about $2.0*10^{16}$ atoms/centimeter$^3$.

Body region 16 is formed by introducing p-type dopants into substrate 20 from surface 26 and diffusing the dopants into epitaxial region 14 to a depth of about 1.5 micrometers. Body region is lightly doped in order to allow an inversion layer to be formed in response to a voltage or electric field as described below. In one embodiment, body region 16 has a doping concentration of about $3.0*10^{17}$ atoms/centimeter$^3$.

Source region 18 comprises a heavily doped region of n-type conductivity to operate as a source of transistor 10. Source region 18 is formed by introducing n-type dopants into substrate 20 from surface 26 and diffusing to a depth of about 0.5 micrometers. In one embodiment, source region 18 has a concentration of about $2*10^{20}$ atoms/centimeter$^3$ to provide a low resistance to current flow.

A layer of dielectric material is formed over surface 26 by depositing silicon nitride and/or silicon dioxide to a thickness of about one micrometer. The dielectric material is then patterned and etched to form a hard mask 17 as shown.

A recessed region 24 is formed by etching portions of surface 20 not protected by hard mask 17 to a depth of about 0.3 micrometers and a width of about one micrometer. In one embodiment, recessed region 24 is formed by using a reactive ion etch process to remove silicon from surface 26 of substrate 20.

A dielectric layer 22 is formed over surface 26 as well as sidewalls 28 and bottom surface 30 of recessed region 24. In one embodiment, dielectric layer 22 is formed with silicon dioxide formed to a thickness of about five hundred angstroms.

Figure 2:
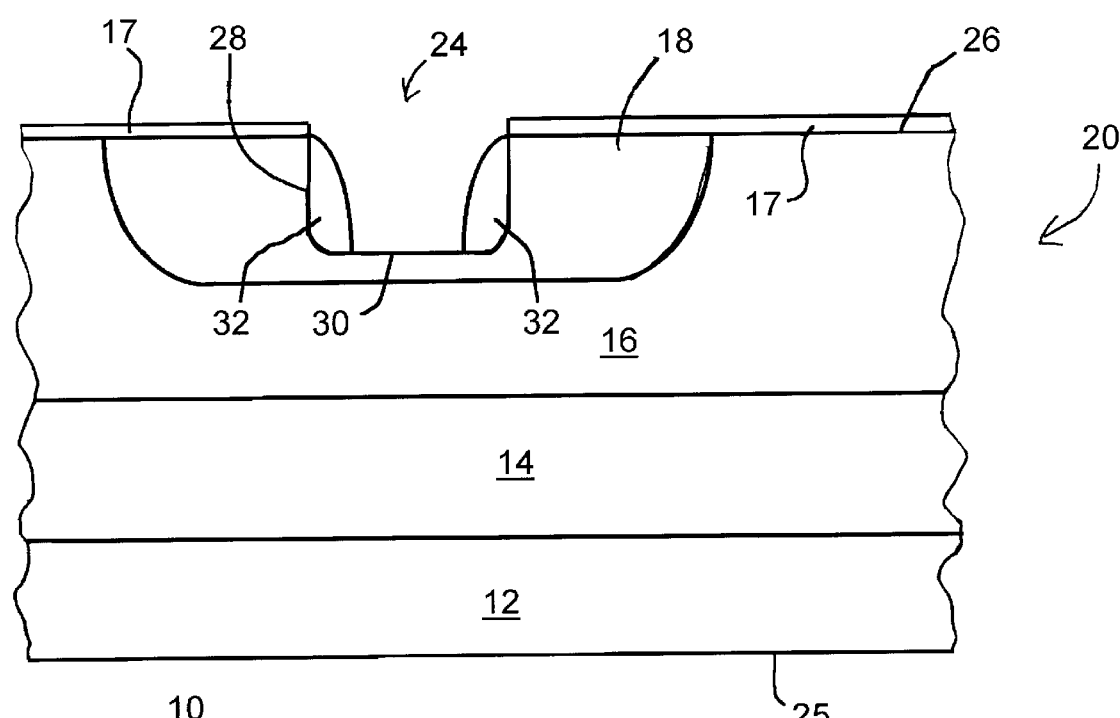
FIG. 2 shows a cross-sectional view of the transistor after a second fabrication step.

FIG. 2 is a cross-sectional view of transistor 10 after a second fabrication step. Substrate 20 is introduced into an etching chamber (not shown) for selectively removing dielectric layer 22 to form spacers 32 along sidewalls 28 of recessed region 24. In one embodiment, spacers are formed using a standard reactive ion etch chemistry selected to have a high preference for etching silicon dioxide and a low preference for etching silicon. Hence, the selective etching step removes material from dielectric layer 22 until the etch front reaches silicon material at bottom surface 30 of recessed region 24. The reactive ion etch process rounds off the upper portions of spacers 32 as shown while the effective width $W_{GS}$ of spacers 32 is about four hundred fifty angstroms.

Figure 3:
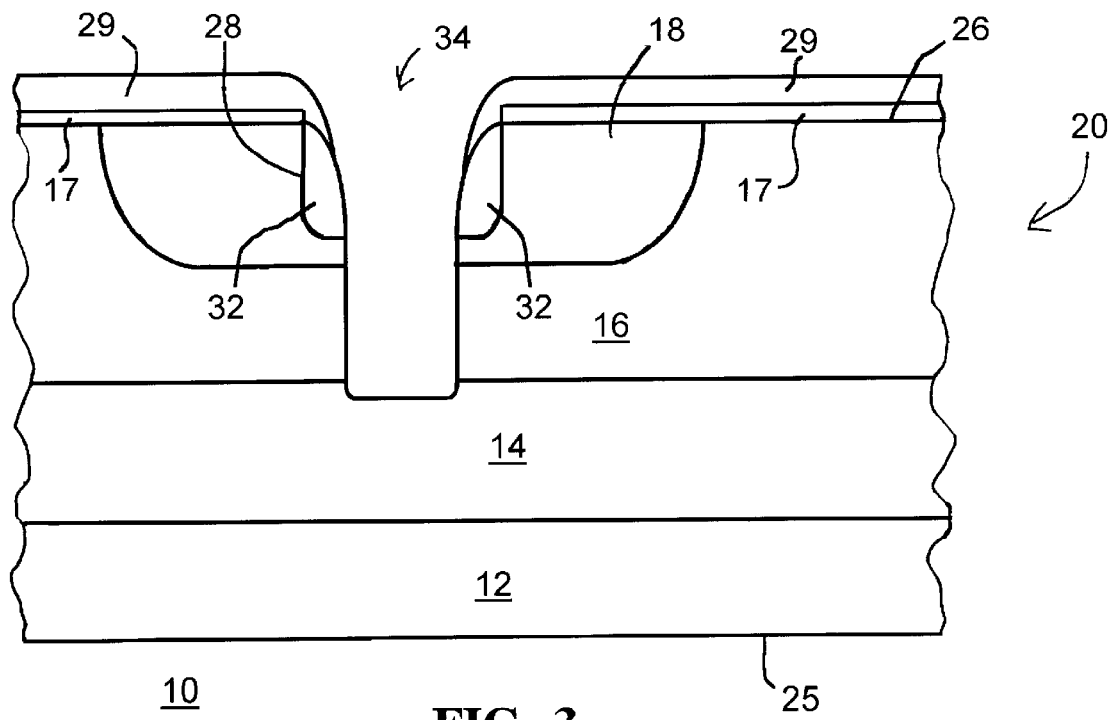
FIG. 3 shows a cross-sectional view of the transistor after a third fabrication step.

FIG. 3 is a cross-sectional view of transistor 10 after a third fabrication step. Substrate 20 is patterned with a hard mask 29 comprising silicon dioxide that protects surface 26 while exposing bottom surface 30 of recessed region 24. Substrate 20 is then subjected to an etch process to selectively remove material from bottom surface 30 to form a trench 34 having a depth of about two micrometers. Note that trench 34 extends about 0.5 micrometers into epitaxial region 14. In one process, hard mask 29 is formed before dielectric layer 22 is etched and a timed etch is used to etch dielectric layer 22 to form spacers 32. This process has an advantage that the etching step for removing material from bottom surface 30 may be performed in situ by changing the etch chemistry from a preferential silicon dioxide etch to a preferential silicon etch after the silicon dioxide etch is complete.

Figure 4:
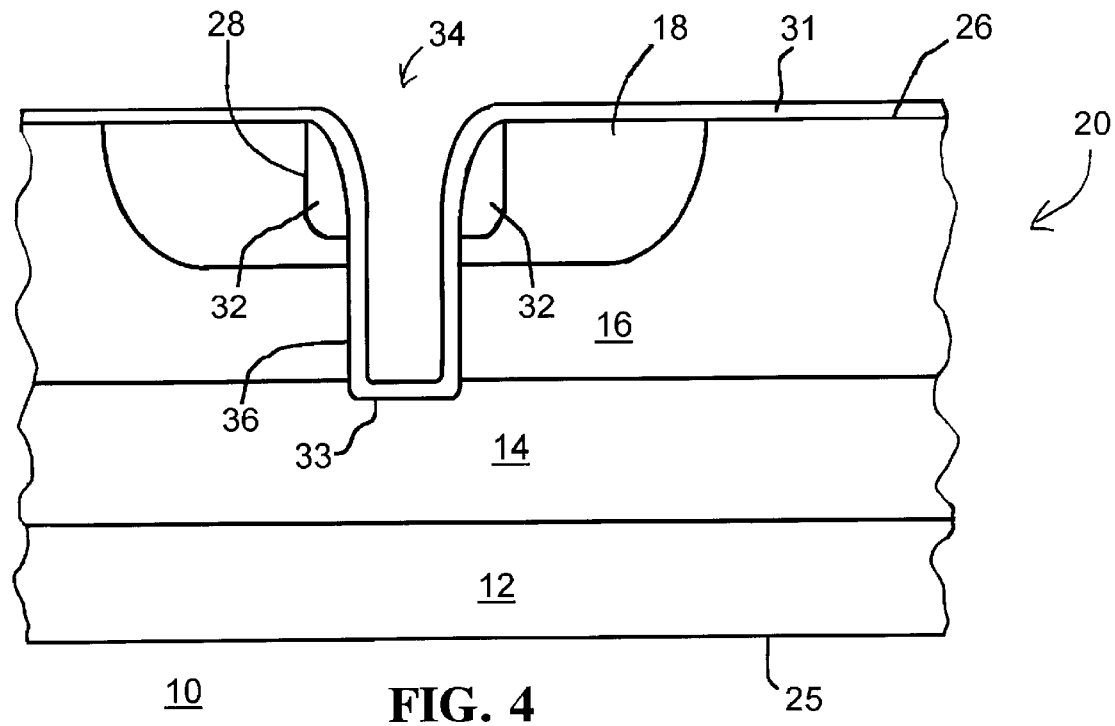
FIG. 4 shows a cross-sectional view of the transistor after a fourth fabrication step.

FIG. 4 is a cross-sectional view of transistor 10 after a fourth fabrication step. Hard masks 17 and 29 are removed using a standard etch process. A blanket dielectric layer 31 is then formed to cover substrate 20, including surface 26 and spacers 32 as well as sidewalls 36 and bottom surface 33 of trench 34. In one embodiment, dielectric layer 31 is formed with silicon dioxide to a thickness of about five hundred angstroms. In an alternative embodiment, hard mask 29 is removed while hard mask 17 is left remaining to protect spacers 32 from being etched during the removal of hard mask 29.

Figure 5:
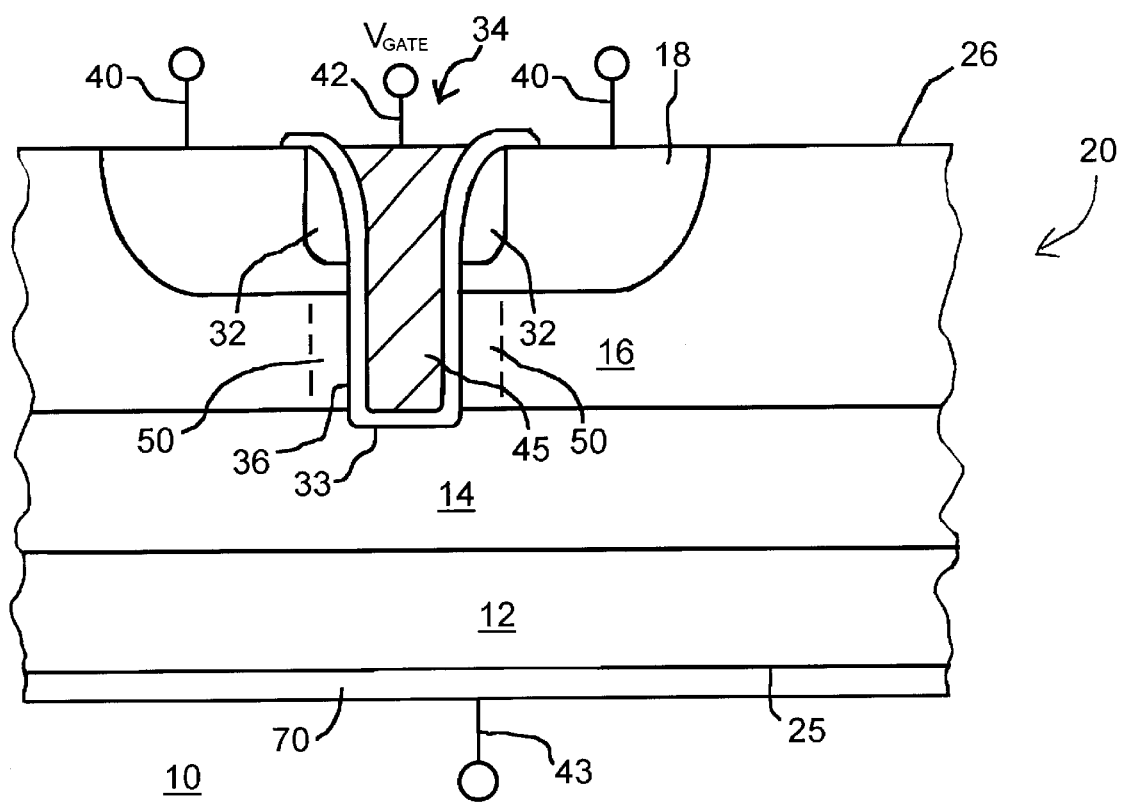
FIG. 5 shows a cross-sectional view of the transistor after a fifth fabrication step.

FIG. 5 is a cross-sectional view of transistor 10 after a fifth fabrication step. Dielectric layer 31 is completely removed and a new dielectric layer is grown to a thickness $W_{GC}$ of about five hundred angstroms and selectively etched to form gate dielectric 35. As an alternative method, portions of dielectric layer 31 are removed with a standard silicon dioxide etch process to leave a remainder portion covering spacers 32 and sidewalls 36 to form gate dielectric 35.

A conductive material such as doped polysilicon is disposed within trench 34 to extend to surface 26 to function as a gate 45. Gate 45 preferably is heavily doped to provide a low gate resistance. Gate 45 is electrically coupled to a gate electrode 42 for receiving a control signal $V_{GATE}$. Current typically flows in gate 45 in a direction parallel to surface 26 and perpendicular to the view plane of FIG. 5.

Similarly, source region 18 has a high conductivity for electrically coupling to a source electrode 40. Drain region 12 has a high conductivity for electrically coupling to a die attach flag 70 of a semiconductor package. Die attach flag 70 is coupled to a drain electrode 43.

In operation, assume that transistor 10 has a gate to source conduction threshold of two volts and that source electrode 40 is operating at ground potential. As control signal $V_{GATE}$ is increased, a gate to source capacitance of transistor 10 causes a minority carrier charge to accumulate in a portion of body region 16 adjacent to sidewall 36. When $V_{GATE}$ increases to a level equal to or greater than the conduction threshold of two volts, so that the minority carrier charge density is greater than the doping level of body region 16, a portion of body region 16 is inverted to form an active region along sidewall 36 designated as conduction channel 50 for routing current between source region 18 and epitaxial region 14.

As the value of $V_{GATE}$ varies, a capacitive gate current flows along gate 45 to charge the gate to source capacitance of transistor 10, which presents a capacitive load to an external drive circuit (not shown). Because transistor 10 is formed with spacers 32 between gate 45 and source region 18, the gate to source capacitance is reduced in comparison to previous transistors that do not have such a spacer. As a result, transistor 10 has a higher switching speed and a lower power dissipation due to switching transients.

Note that the increased dielectric thickness provided by spacers 32 adjacent to source region 18 allows gate 45 to extend within trench 34 to surface 26 while maintaining a low gate to source capacitance. As a result, gate 45 is formed with a large cross-sectional area to provide a low gate resistance to further increase the switching speed. Hence, by increasing the dielectric thickness adjacent to source region 18 with spacers 32, a low gate resistance is achieved while maintaining a low gate to source capacitance and without increasing the die size of transistor 10. In addition, because spacers 32 increase the dielectric thickness, electrical stress adjacent to surface 26 is reduced, which increases the reliability of transistor 10.

Figure 6:
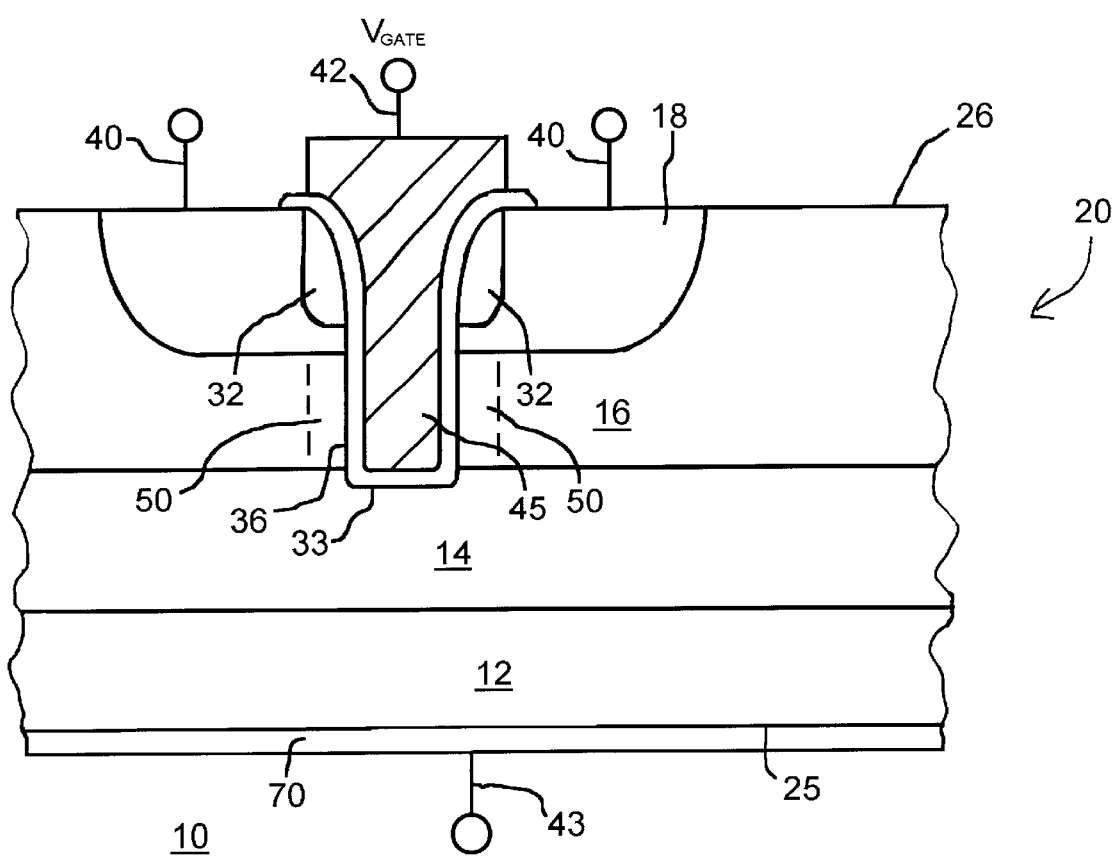
FIG. 6 shows a cross-sectional view of the transistor in a second embodiment.

FIG. 6 shows a cross-sectional view of transistor 10 in an alternate embodiment. Elements of the alternate embodiment have characteristics similar to those described above, except that gate 45 is formed to extend above surface 26 as shown, thereby providing yet a larger cross-sectional area and lower gate resistance for transistor 10. Spacers 32 allow the lower gate resistance to be achieved without significantly increasing the total gate capacitance of transistor 10. Hence, a further increase in switching speed and performance is achieved without increasing the die area occupied by transistor 10.

Figure 7:
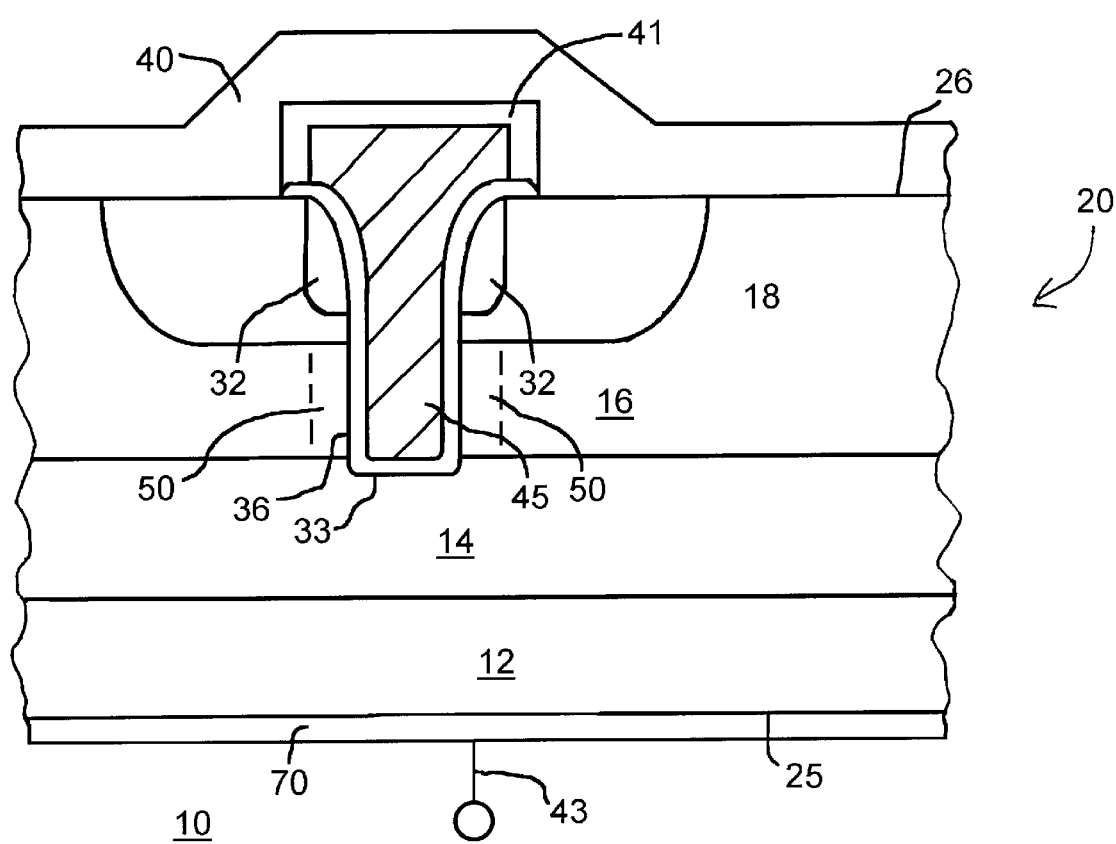
FIG. 7 shows a cross-sectional view of the transistor of the second embodiment including further detail of the metalization.

FIG. 7 shows a cross-sectional view of transistor 10 of the second embodiment including further detail of the interconnect structure on surface 26. A dielectric spacer 41 is formed to a thickness of 0.5 micrometers to provide electrical isolation between source electrode 40 and gate 45. In one embodiment, dielectric spacer comprises silicon dioxide.

Source electrode 40 is formed by depositing and patterning a layer of metal over surface 26 as shown to make an ohmic connection to source regions 18 and to a bonding pad (not shown). In one embodiment, source electrode 40 comprises aluminum. The metal layer typically is patterned to form gate electrode 42 as well. Gate electrode 42 is coupled to gate electrode 42 in a region out of the view plane of FIG. 7 and is not shown in order to simplify the figure. For example, gate electrode 42 often is formed at the end of trench 45. Hence, gate current flows through gate 45 in a direction parallel to surface 26.

In summary, the present invention provides a power transistor that has a low fabrication cost and a high performance. A substrate has a surface that is formed with a trench. A control electrode is disposed at the surface for activating a conduction path along a sidewall of the trench with a control signal. A dielectric layer is formed between the sidewall and the control electrode to have a first width adjacent to the surface of the substrate and a second width smaller than the first width adjacent to the conduction path. The thicker dielectric layer adjacent to the surface produces a small gate to source capacitance. By disposing the control electrode at the first surface, a low gate resistance is provided. The low gate capacitance and resistance produce a high switching speed in the semiconductor device without increasing the die area occupied by the device.

What is claimed is:

1. A semiconductor device, comprising:
    a substrate having a first surface for defining a trench, a control electrode disposed at the first surface for activating a conduction path along a sidewall of the trench with a control signal, and a first doped region formed on a second surface of the substrate for electrically coupling to the conduction path; and
    a dielectric layer formed between the sidewall and the control electrode to have a first width adjacent to the first surface and a second width smaller than the first width adjacent to the conduction path.

2. The semiconductor device of claim 1, further comprising a second doped region formed at the first surface of the substrate, where the dielectric layer has the first width adjacent to the second doped region.

3. The semiconductor device of claim 1, wherein the control electrode is formed with polycrystalline silicon.

4. The semiconductor device of claim 3, wherein the control electrode extends a distance above the first surface of the substrate.

5. The semiconductor device of claim 1, wherein the substrate comprises silicon and the dielectric material includes silicon dioxide.

6. The semiconductor device of claim 1, further comprising a semiconductor package for mounting the substrate.

7. A transistor, comprising:
   a semiconductor substrate having a first surface for forming a first doped region and an adjacent trench;
   a control electrode disposed within the trench and extending to the first surface for receiving a control signal that activates a conduction channel along a sidewall of the trench for electrically coupling through a second doped region adjacent to a second surface of the semiconductor substrate; and
   a dielectric material lining the sidewall of the trench to have a first thickness adjacent to the conduction channel and a second thickness greater than the first thickness adjacent to the first doped region.

8. The transistor of claim 7, wherein the first and second doped regions have a first conductivity type and the semiconductor substrate has a second conductivity type adjacent to the conduction channel.

9. A method of making a semiconductor device, comprising the steps of:
   etching a first surface of a semiconductor substrate to form a recessed region having a surface lined with a first dielectric layer;
   etching the recessed region to form a trench having a sidewall for defining a channel of the semiconductor device;
   doping a second surface of the semiconductor substrate for electrically coupling the second surface to the channel; and
   forming a second dielectric layer over the first dielectric layer and the sidewall of the trench.

10. The method of claim 9, further comprising the steps of:
    lining the recessed region with a dielectric material; and
    removing the dielectric material from a bottom surface of the recessed region to form the first dielectric layer.

11. The method of claim 10, wherein the step of removing includes the step of selectively etching the recessed region to remove the dielectric material from the bottom surface.

12. The method of claim 11, wherein the step of selectively etching includes the step of reactive ion etching silicon dioxide.

13. The method of claim 12, further comprising the step of doping the semiconductor substrate to form a first doped region adjacent to the first dielectric layer for coupling to a first end of the channel.

14. The method of claim 13, wherein the step of doping the second surface of the semiconductor substrate includes the step of doping the second surface to form a second doped region coupled to a second end of the channel.

15. The method of claim 9, wherein the step of etching the recessed region includes the step of reactive ion etching silicon.

16. The method of claim 15, wherein the step of etching the recessed region further includes the step of reactive ion etching silicon in situ.

17. The method of claim 9, further comprising the step of disposing a conductive material in the trench to form a control electrode of the semiconductor device.

18. A method of manufacturing a transistor, comprising the steps of:
    etching a first surface of a semiconductor substrate to form a recessed region having a sidewall adjacent to a first doped region;
    disposing a dielectric spacer along the sidewall of the recessed region;
    etching the recessed region to form a trench, where a sidewall of the trench defines an active portion of the transistor; and
    doping a second surface of the semiconductor substrate for electrically coupling to the active portion.

19. The method of claim 18, further comprising the step of forming a dielectric layer along the dielectric spacer and the sidewall of the trench.

20. The method of claim 19, wherein the step of disposing includes the step of disposing silicon dioxide along the sidewall of the recessed region.

21. The method of claim 20, wherein the step of forming includes the step of forming the dielectric layer with silicon dioxide.

22. The method of claim 18, further comprising the step of disposing a conductive material in the trench to form a control electrode of the transistor.

23. The method of claim 18, wherein the step of etching the recessed region includes the step of etching the recessed region after the step of disposing the dielectric spacer.

* * * * *